(12) United States Patent
Abel

(10) Patent No.: US 10,825,443 B2
(45) Date of Patent: Nov. 3, 2020

(54) METHOD AND SYSTEM FOR IMPLEMENTING A MODAL PROCESSOR

(71) Applicant: Jonathan Stuart Abel, Menlo Park, CA (US)

(72) Inventor: Jonathan Stuart Abel, Menlo Park, CA (US)

(\*) Notice: Subject to any disclaimer, the term of this patent is extended or adjusted under 35 U.S.C. 154(b) by 0 days.

(21) Appl. No.: 16/432,866

(22) Filed: Jun. 5, 2019

(65) Prior Publication Data

US 2020/0090637 A1 Mar. 19, 2020

Related U.S. Application Data

(63) Continuation-in-part of application No. 16/384,266, filed on Apr. 15, 2019, which is a continuation of application No. 15/796,327, filed on Oct. 27, 2017, now Pat. No. 10,262,645, which is a continuation of application No. 14/558,531, filed on Dec. 2, 2014, now Pat. No. 9,805,704, application No. 16/432,866, which is a continuation-in-part of application No. 16/030,789, filed on Jul. 9, 2018, now abandoned, which is a continuation of application No. 15/201,013, filed on Jul. 1, 2016, now Pat. No. 10,019,980.

(60) Provisional application No. 62/188,299, filed on Jul. 2, 2015, provisional application No. 62/061,219, filed on Oct. 8, 2014, provisional application No.
(Continued)

(51) Int. Cl.
| | | |
|---|---|---|
| *G10K 15/08* | (2006.01) | |
| *G06F 17/15* | (2006.01) | |
| *H03H 17/02* | (2006.01) | |
| *G10H 1/02* | (2006.01) | |
| *G10K 15/12* | (2006.01) | |
| *G10H 1/12* | (2006.01) | |
| *G10H 5/02* | (2006.01) | |
| *G01R 23/00* | (2006.01) | |
| *G10H 1/36* | (2006.01) | |
| *G10H 5/00* | (2006.01) | |

(52) U.S. Cl.
CPC .............. *G10K 15/12* (2013.01); *G10H 1/125* (2013.01); *G01R 23/00* (2013.01); *G10H 1/366* (2013.01); *G10H 5/007* (2013.01); *G10H 5/02* (2013.01); *G10H 2210/281* (2013.01); *G10H 2210/311* (2013.01); *G10H 2210/325* (2013.01); *G10H 2250/111* (2013.01); *H03H 17/02* (2013.01)

(58) Field of Classification Search
CPC ........ G10H 2250/111; G10H 2210/311; G10H 5/007; G10H 1/043; G10K 15/12; G10K 15/08; G10K 11/002; G10K 15/10; G06F 17/15; H03H 7/12; H03H 17/00
USPC ........................................................... 381/63
See application file for complete search history.

(56) References Cited

U.S. PATENT DOCUMENTS

| | | | |
|---|---|---|---|
| 2008/0232603 A1\* | 9/2008 | Soulodre | G01H 7/00 381/63 |
| 2016/0269828 A1\* | 9/2016 | Smith | H04R 3/007 |
| 2017/0134854 A1\* | 5/2017 | Lindahl | H03H 17/0261 |

\* cited by examiner

*Primary Examiner* — Paul Kim
*Assistant Examiner* — Ubachukwu A Odunukwe
(74) *Attorney, Agent, or Firm* — Foley & Lardner LLP

(57) ABSTRACT

The implementation of modal processors, which involve the parallel combination resonant filters, may be costly for applications such as artificial reverberation that can require thousands of modes. In one embodiment, the input signal is decomposed into a plurality of subbands, the outputs of which are downsampled. In each downsampled band, resonant filters are applied at the downsampled sampling rate,
(Continued)

and their output is upsampled and filtered to form the band output.

17 Claims, 15 Drawing Sheets

Related U.S. Application Data

61/913,093, filed on Dec. 6, 2013, provisional application No. 61/910,548, filed on Dec. 2, 2013, provisional application No. 62/732,574, filed on Sep. 17, 2018.

METHOD AND SYSTEM FOR IMPLEMENTING A MODAL PROCESSOR

CROSS-REFERENCE TO RELATED APPLICATIONS

The present application is a continuation-in-part of U.S. patent application Ser. No. 16/384,266 filed Apr. 15, 2019, which application is a continuation of U.S. patent application Ser. No. 15/796,327 filed Oct. 27, 2017, now U.S. Pat. No. 10,262,645, which application is a continuation of U.S. patent application Ser. No. 14/558,531, filed Dec. 2, 2014, now U.S. Pat. No. 9,805,704, which application claims priority to U.S. Provisional Patent Application No. 62/061,219 filed Oct. 8, 2014, 61/913,093 filed Dec. 6, 2013 and 61/910,548 filed Dec. 2, 2013. The present application is also a continuation-in-part of U.S. patent application Ser. No. 16/030,789 filed Jul. 9, 2018, which application is a continuation of U.S. patent application Ser. No. 15/201,013 filed Jul. 1, 2016, now U.S. Pat. No. 10,019,980, which application claims priority to U.S. Provisional Patent Application No. 62/188,299 filed Jul. 2, 2015. The present application also claims priority to U.S. Provisional Patent Application No. 62/732,574 filed Sep. 17, 2018. The contents of all the above applications are incorporated herein by reference in their entirety.

TECHNICAL FIELD

The present embodiments relate generally to signal processing, and more particularly to the implementation of audio processing systems having a parallel bank of resonant filters, including modal reverberators and modal processors.

BACKGROUND

While acoustic spaces and vibrating systems have long been studied using modal analysis (see, e.g., N. H. Fletcher and T. D. Rossing, Physics of Musical Instruments, Springer, 2nd edition, 2010, A. Benade, Fundamentals of Musical Acoustics. Oxford University Press, 1976., pg. 172 et seq., and P. Morse and K. Ingard, Theoretical Acoustics. Princeton University Press, 1987, pg. 576 et seq.), such systems have only recently been synthesized using modal structures. In J. Abel et al., "A modal architecture for artificial reverberation," The Journal of the Acoustical Society of America, vol. 134, no. 5, p. 4220, 2013 and J. Abel et al., "A modal architecture for artificial reverberation with application to room acoustics modeling," in Audio Engineering Society Convention, vol. 137, (Los Angeles, Calif.), October 9-12 2014, the so-called "modal reverberator" was introduced, implementing reverberation as the sum of resonant filters, one for each mode of the system. The resulting parallel structure allows accurate modeling of the acoustic space or object, and provides explicit, interactive control over its features with no computational latency.

One drawback of the modal reverberator can be its computational cost. There are many acoustic spaces and vibrating objects with a large number of modes in the audio band, and several thousand resonant filters may be needed to accurately implement the desired system. For instance, FIG. 1 are diagrams illustrating a measured and modeled room impulse response (A) for a small room and the corresponding spectrograms for the modeled response (B) and the measured response (C). As shown in FIG. 1, the response is well modeled using 1600 modes across the audio band. Assuming six multiply-accumulates (MACs) per sample for each mode filter, such a system would require about 10,000 MACs per sample, and around 500 MIPS, assuming a single-instruction MAC. Though the parallel structure may be used to reduce the MIPS requirements in certain microprocessors, there is a need for a modal reverberator implementation having a lower computational cost.

In J. Abel and K. Werner, "Distortion and Pitch Processing Using a Modal Reverberator Architecture," in Proceedings of the 18th International Conference on Digital Audio Effects (DAFx-15), Trondheim, Norway, 30 November-3 December 2015 (hereinafter "[3]"), the implementation of the mode filters is manipulated to incorporate other audio processors into the modal reverberator, including pitch shifting and distortion. Accordingly, there is also a need to provide an efficient implementation of the "modal processor" structures.

SUMMARY

According to certain aspects, the present embodiments provide a method and system for efficiently implementing a parallel sum of resonant filters that is at the core of the modal reverberator and modal processor systems.

In one embodiment, the input is processed in frequency subbands defined by a bank of filters, at least two of which have non-overlapping pass bands, transition bands, and stop bands, and with each frequency in the audio band appearing in either a single pass band, or a pair of transition bands. Each mode filter is assigned to a single subband or a pair of subbands according to its mode frequency. Downsampled subband signals are formed, and processed with their associated down sampled mode filters. In a related embodiment, some of the pass bands overlap in frequency, and mode filters that would have been assigned to two adjacent subbands are instead assigned to separate subbands.

In another embodiment, downsampled subbands are formed through a process that includes the steps of heterodyning, low-pass filtering, and downsampling. In this case, the mode frequencies are adjusted according to the heterodyning frequency and downsampling factor.

In a further embodiment, the mode gains are adjusted according to the characteristics of the filters used to split the signal into subbands, including adjustments to accommodate pass band ripple.

In still another embodiment, a wideband "residual" filter is applied to the input in parallel with the subband processing.

In yet another embodiment, the mode frequencies are used to design subband frequency ranges and associated downsampling factors so as to reduce the computation needed to implement the modal filter.

In a further embodiment, the downsampling and subband frequencies are designed to accommodate the increased bandwidth from pitch processing. In another embodiment, distortion products or frequency shifted components initially processed in one subband are added into other subbands, preferably at the same downsampling factor.

BRIEF DESCRIPTION OF THE DRAWINGS

These and other aspects and features of the present embodiments will become apparent to those ordinarily skilled in the art upon review of the following description of specific embodiments in conjunction with the accompanying figures, wherein.

DETAILED DESCRIPTION

The present embodiments will now be described in detail with reference to the drawings, which are provided as illustrative examples of the embodiments so as to enable those skilled in the art to practice the embodiments and alternatives apparent to those skilled in the art. Notably, the figures and examples below are not meant to limit the scope of the present embodiments to a single embodiment, but other embodiments are possible by way of interchange of some or all of the described or illustrated elements. Moreover, where certain elements of the present embodiments can be partially or fully implemented using known components, only those portions of such known components that are necessary for an understanding of the present embodiments will be described, and detailed descriptions of other portions of such known components will be omitted so as not to obscure the present embodiments. Embodiments described as being implemented in software should not be limited thereto, but can include embodiments implemented in hardware, or combinations of software and hardware, and vice-versa, as will be apparent to those skilled in the art, unless otherwise specified herein. In the present specification, an embodiment showing a singular component should not be considered limiting; rather, the present disclosure is intended to encompass other embodiments including a plurality of the same component, and vice-versa, unless explicitly stated otherwise herein. Moreover, applicants do not intend for any term in the specification or claims to be ascribed an uncommon or special meaning unless explicitly set forth as such. Further, the present embodiments encompass present and future known equivalents to the known components referred to herein by way of illustration.

According to certain aspects, the present embodiments build upon and extend principles of the modal reverberator architecture described in U.S. Pat. Nos. 10,262,645 and 10,019,980, the contents of which are incorporated herein by reference in their entireties.

Figure 1:
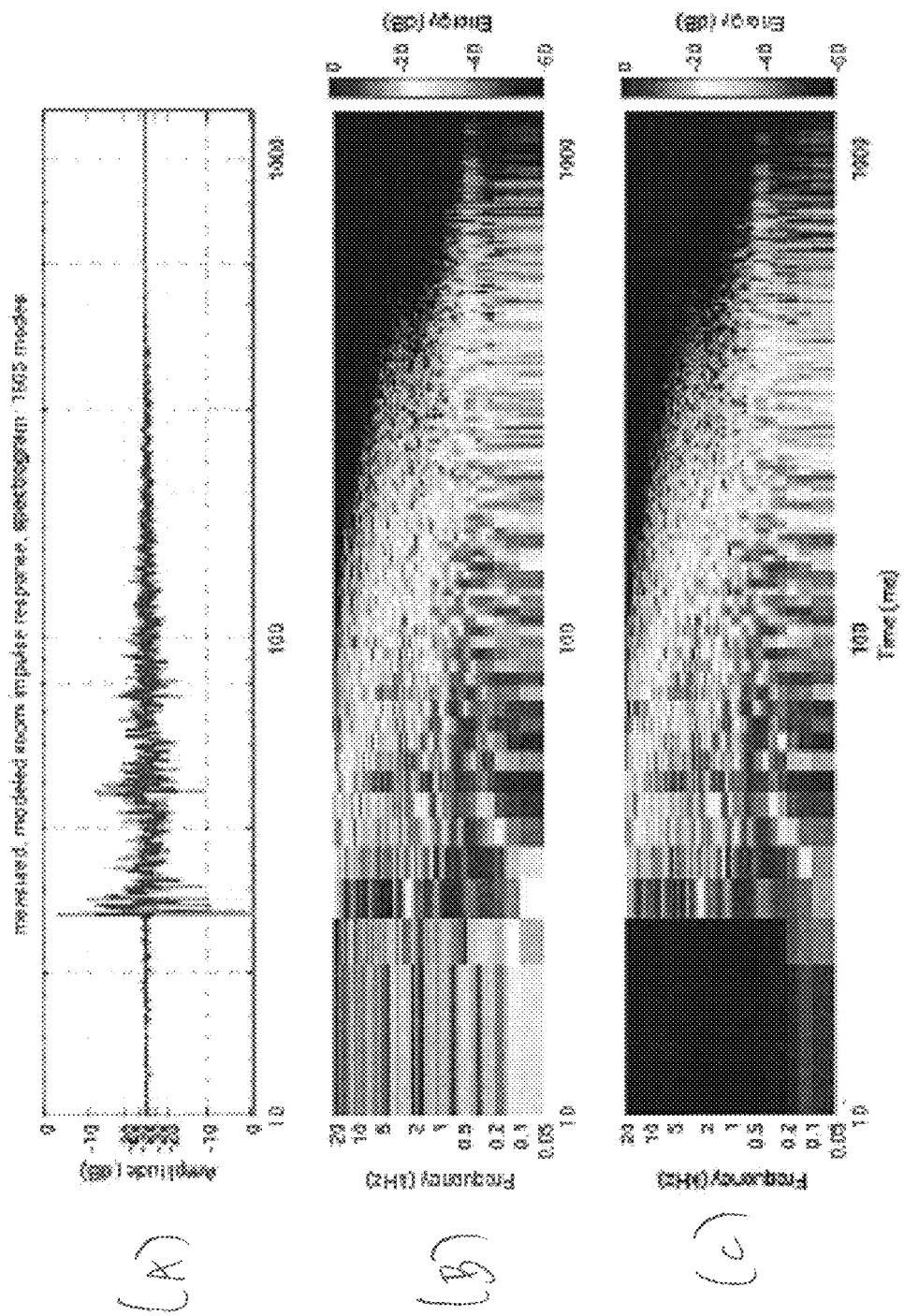
FIG. 1 are diagrams illustrating an example of measured and modeled room impulse responses for a small room are overlaid (top), and the corresponding spectrograms.
Figure 2:
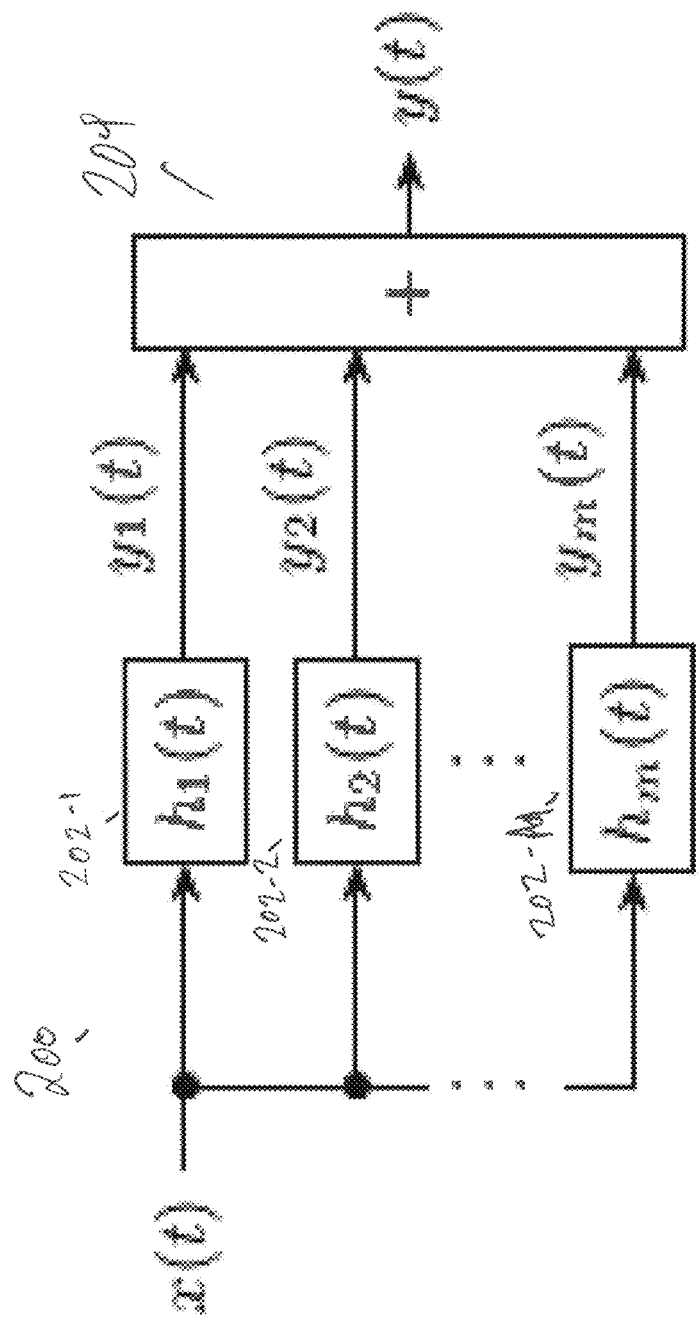
FIG. 2 is a block diagram illustrating an example Modal Reverberator Architecture.

The modal reverberator architecture is shown in FIG. 2. The reverberator impulse response, denoted by h(t) where t represents time, is the sum of M mode responses $h_m(t)$, m=1, 2, . . . . M, $$h(t) = \sum_{m=1}^{M} h_m(t), \quad (1)$$

The system output y(t) in response to an input x(t), that is the convolution $$y(t)=h(t)*x(t), \quad (2)$$

is then seen to be the sum of mode outputs $$y(t) = \sum_{m=1}^{M} y_m(t), \quad y_m(t) = h_m(t) * x(t), \quad (3)$$

where the mth mode output $y_m(t)$ is the mth mode response convolved with the input. The modal reverberator 200 simply implements this parallel combination by 204 of mode responses 202 determined by (3), as shown in FIG. 2.

Typically, the mode responses $h_m(t)$ are complex exponentials, each characterized by a mode frequency $\omega_m$, mode damping $\alpha_m$ and complex mode amplitude $\gamma_m$, $$h_m(t)=\gamma_m \exp\{(j\omega_m-\alpha_m)t\}. \quad (4)$$

The mode frequencies and dampings are properties of the room or object. They describe, respectively, the various mode oscillation frequencies and decay times. The mode amplitudes are determined by the sound source and listener positions (e.g., driver and pick-up positions for an electromechanical device, or loudspeaker and microphone positions for a room), according to the mode spatial patterns.

Figure 3:
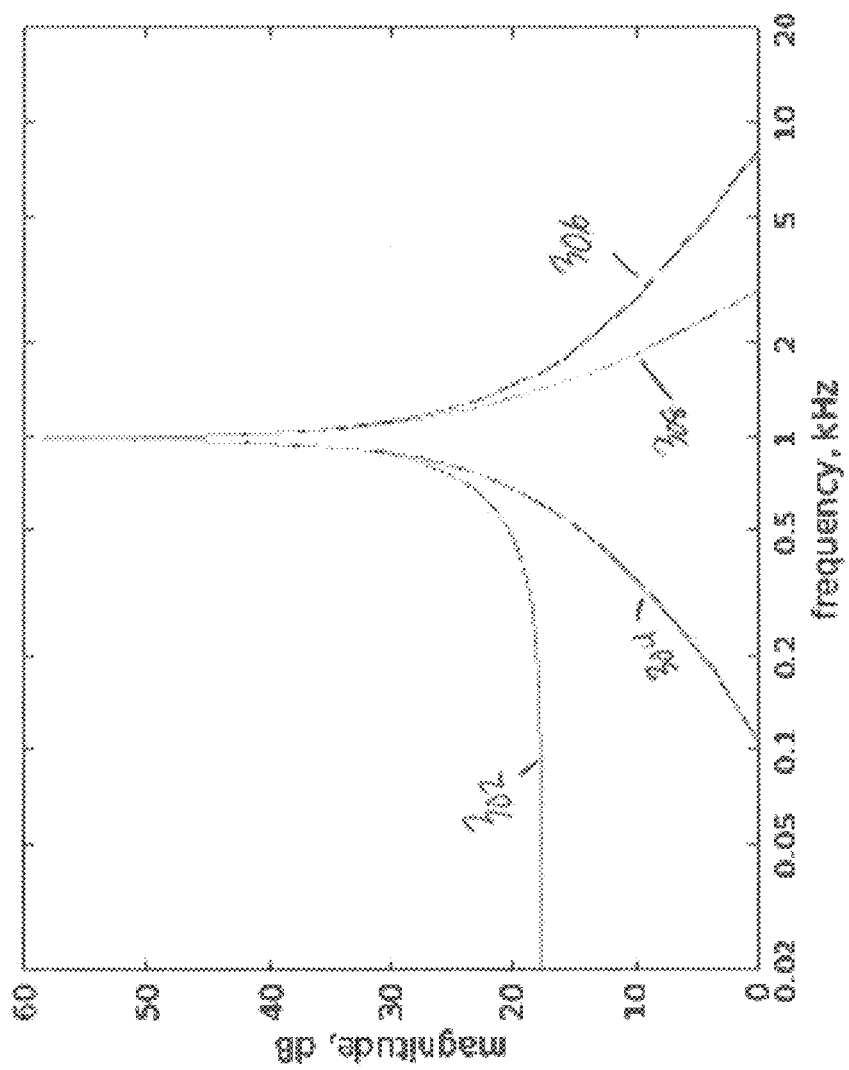
FIG. 3 is a diagram illustrating example mode transfer function magnitudes.

Note that even for short reverberation times of just a few hundred milliseconds, the mode responses $h_m(t)$ are very resonant, and last many thousands of samples at typical audio sampling rates. Example transfer function magnitudes are shown in FIG. 3 for the real and imaginary components of a complex exponential mode filter (4) having a mode frequency of 1000 kHz and a 60 dB decay time of 250 ms. Both the imaginary and real parts have strong resonant peaks: The imaginary part has a resonant low-pass characteristic 302, with the "pass band" about 40 dB below the resonant peak, and falling off like frequency squared away from the cutoff (308). The real part 304 has a resonant peaking characteristic, with the transfer function magnitude falling off at 6 dB per octave away from the 1 kHz resonance (308).

Such strongly resonant systems present numerical implementation challenges, which standard biquad forms might not overcome. One method with good numerics is the phasor filter (see, e.g., M. Mathews, J. O. Smith III, "Methods for synthesizing very high Q parametrically well behaved two pole filters," in Stockholm Musical Acoustics Conference (SMAC), Stockholm, Sweden, Aug. 6-9 2003 and D. Massie, "Coefficient interpolation for the Max Mathews phasor filter," in Audio Engineering Society Convention, San Francisco, Calif., Oct. 26-29 2012, vol. 133), in which each mode filter is implemented as a complex first-order update, $$y_m(t) = \gamma_m x(t) + e^{(j\omega_m - \alpha_m)} y_m(t-1). \quad (5)$$

Figure 4:
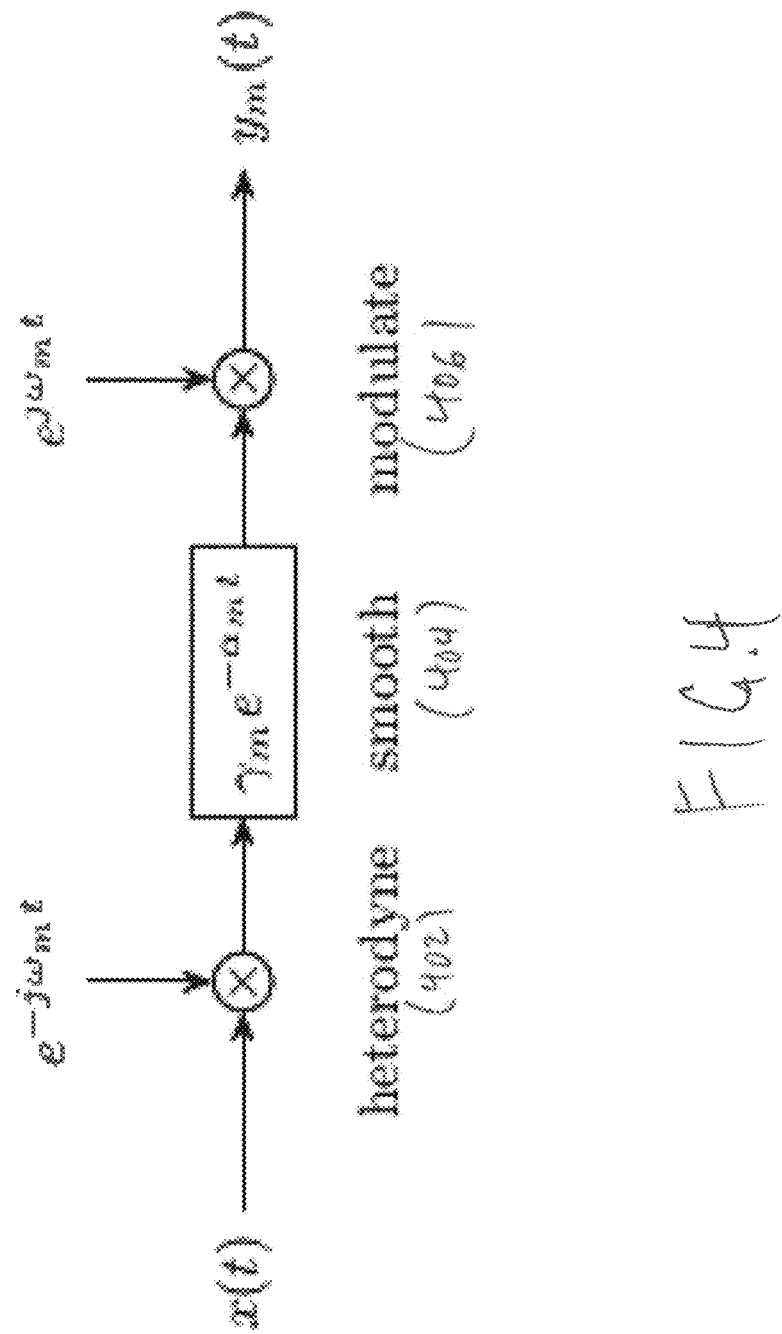
FIG. 4 is a block diagram illustrating an example Mode Response Implementation.

Another approach is to implement the mode filtering as shown in FIG. 4 by heterodyning the input signal to dc at 402 to form a baseband response, smoothing this baseband response by convolution with an exponential at 404, and modulating the result back to the audio band at 406, $$y_m(t) = e^{j\omega_m t} \cdot (\gamma_m e^{-\alpha_m t} * [e^{-j\omega_m t} x(t)]). \quad (6)$$

The heterodyning and modulation steps implement the mode frequency, and the smoothing filter generates the mode envelope, in this case an exponential decay.

As described in [3], if the modulator $e^{j\omega_m t}$ were replaced with one at a different frequency, $c^{j\nu_m t}$, the mode filter output would be frequency shifted. Similarly, by resampling the term in parentheses in (6), the filter output will be time stretched. Also, by applying a memoryless nonlinearity to or otherwise replacing the modulator, the filter output will be distorted.

The present applicant recognizes that there are a number of settings in which it is desired to process signals in separate frequency subbands. For example, in audio data compression, high-frequency bands are allocated fewer bits than low-frequency bands, according to the sensitivity of human hearing. In the present embodiments, the modal filter is processed in subbands, with each mode of the system appearing in only a few, preferably just one or two, frequency bands. This is made possible since mode filters have such strong resonances. For a typical filterbank, energy at the mode output would appear in at most two adjacent bands. By separating the input signal into downsampled subbands, the cost of implementing the mode filters may be significantly reduced. This is because the computational cost of the recursive mode filters is proportional to the sampling rate, and therefore inversely proportional to the downsampling ratio. For instance, at a sampling rate of 48 kHz, a filterbank having 16 bands could produce more than a factor of eight reduction in computational cost.

Figure 5:
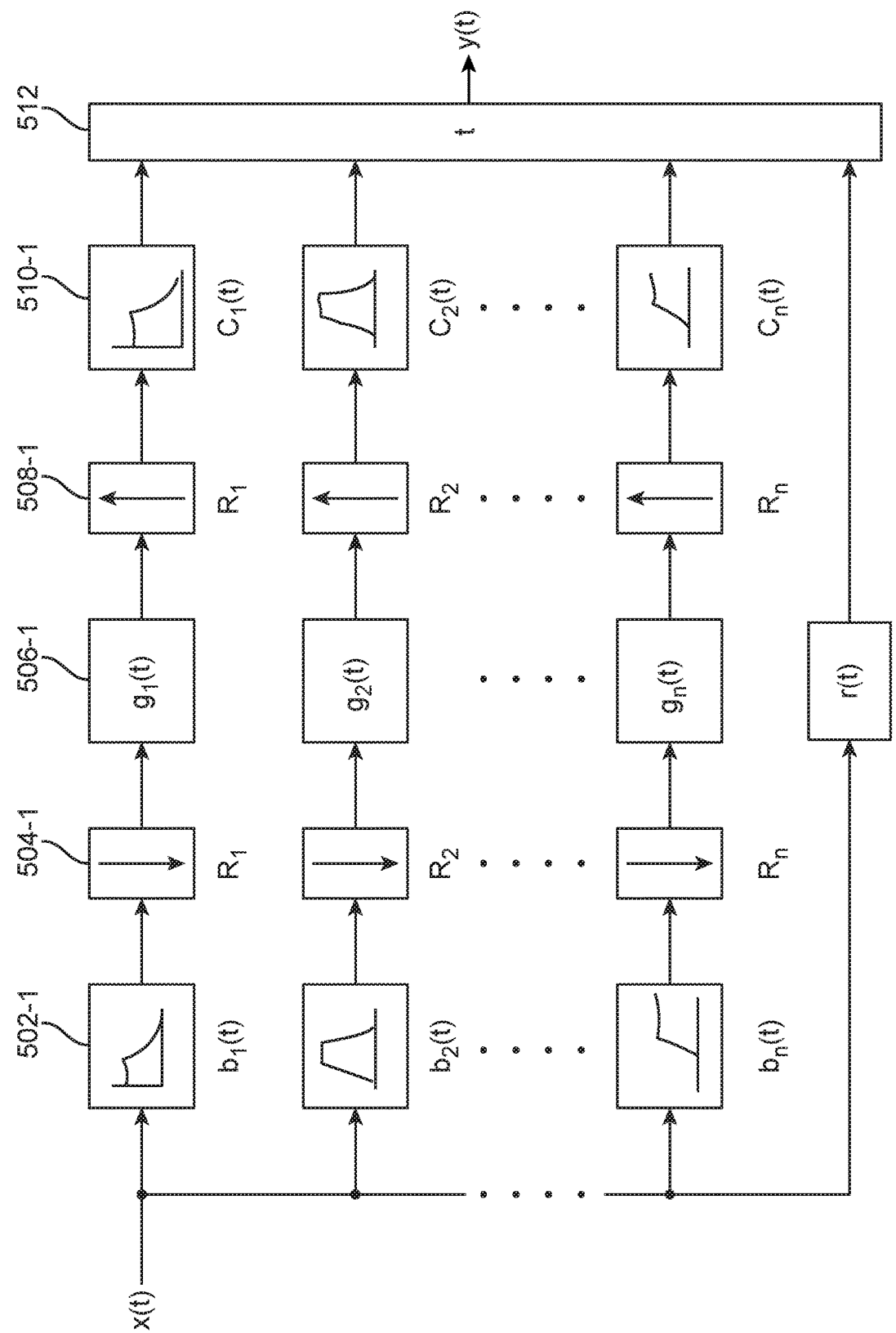
FIG. 5 is a block diagram illustrating example subband modal processing according to embodiments.

An example system according to embodiments is shown in FIG. 5, in which the input is processed in a set of N frequency subbands by applying band splitting filters $b_n(t)$, n=1, 2, ..., N at 502, and downsampling the filter outputs at 504. Each downsampled subband is processed according to only those modal filters 506 having significant energy in that subband. The processed subband modal filter outputs are upsampled at 508 and filtered at 510 according to corresponding reconstruction filters $c_n(t)$, n=1, 2, ... N, and combined at 512 to form the output.

In this system, the modal filter $$h(t) = \sum_{m=1}^{M} h_m(t) \quad (7)$$

is divided into N frequency subbands according to the band splitting filters $b_n(t)$. In the nth band, the filtered modal response $g_n(t)$ is $$g_n(t) = \sum_{m=1}^{M} b_n(t) * h_m(t). \quad (8)$$

Assuming that each resonant mode filter $h_m(t)$ contains significant energy in only a few bands, and that the band splitting filter is approximately flat over its pass band, the band filtered modal response is approximately $$g_n(t) \approx \sum_{p: f_p \in [f_n^-, f_n^+]} h_p(t), \quad (9)$$

where the summation is over those mode filters having mode frequencies in the range:

$$[f_n^-, f_n^+]$$

according to the corresponding frequency subband. Because each subband n occupies only a limited frequency range, the subband signal may be downsampled, for example by a factor of $R_n$, without loss of information. The downsampling ratio $R_n$ is typically the largest integer less than the Nyquist limit $f_s/2$ divided by the nth subband bandwidth. To avoid aliasing artifacts, while maintaining computational efficiency, that integer might be reduced. By processing the mode filters at the downsampled sampling rate, computational cost will be reduced by roughly the downsampling ratio $R_n$.

The output of the system (ignoring aliasing effects from the downsampling and upsampling, which may be minimized by choice of $b_n(t)$ and $c_n(t)$) is $$\hat{h}(t) = \sum_{n=1}^{N} g_n(t), \quad (10)$$

which approximates h(t). The approximation may be made more accurate by adjusting the mode amplitudes in each subband according to the band splitting and reconstruction filters, respectively, $b_n(t)$ and $c_n(t)$, to account for pass band ripple and other effects. For instance if the pass band through the system is down 1 dB at the mode frequency of a given mode filter, then its associated mode amplitude could be increased by 1 dB. Similarly, if multiple subbands contain a given mode filter, and their complex amplitudes don't sum to the desired complex amplitude (or ) magnitude, for instance) at the system output, one or more of the complex amplitudes could be adjusted to produce the desired sum.

The approximation may also be improved by including a parallel wideband filter 514, r(t), $$\hat{h}(t) = \sum_{n=1}^{N} g_n(t) + r(t). \quad (11)$$

This additional wideband filter would account for mode filter energy outside of their assigned subbands, as well as subtle differences in their assigned subbands. This "residual" filter may be designed using the difference between the desired modal response h(t) and the subband processing response $\hat{h}(t)$ as a target impulse response.

Figure 6:
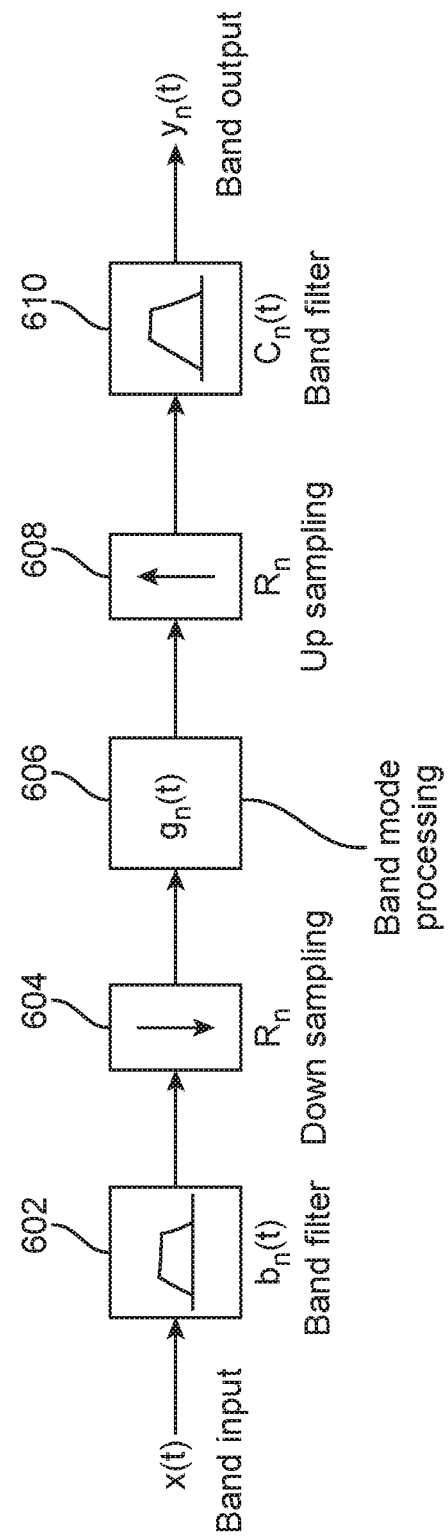
FIG. 6 is a block diagram illustrating an example of subband band processing according to embodiments.

The subband processing may be done using filtering and downsampling, as shown in FIG. 6. Here, the input signal is filtered at 602 using a subband filter $b_n(t)$ having a pass band, transition band, and a stop band. The subband filter will have energy only over a small bandwidth, and is downsampled at 604 by a factor of $R_n$. The downsampled signal is processed in a downsampled set of mode filters at 606:

$$\tilde{h}_p(t),$$

where the mode frequencies and dampings are adjusted according to the subband n downsampling ratio $R_n$, $$\tilde{h}_p(t) = R_n \gamma_p \exp\{(j \text{ rem } (R_n \omega_p, 2\pi) - R_n \alpha_p)t\}. \quad (12)$$

where rem( ) represents the remainder function, and t~ is the downsampled sample number. Note that the scaling of the decay rate by the downsampling ratio is due to the downsampled samples covering a factor of $R_n$, more time. Similarly, the modal frequency is increased by a factor of $R_n$, and aliased to the downsampled unit circle. The amplitude is likewise increased by the factor $R_m$, as the downsampling and upsampling reduce the amplitude of the subband signal by the downsampling ratio. After applying the subband mode filters, the signal is upsampled at 608, filtered at 610, and summed to form the output.

Figure 7:
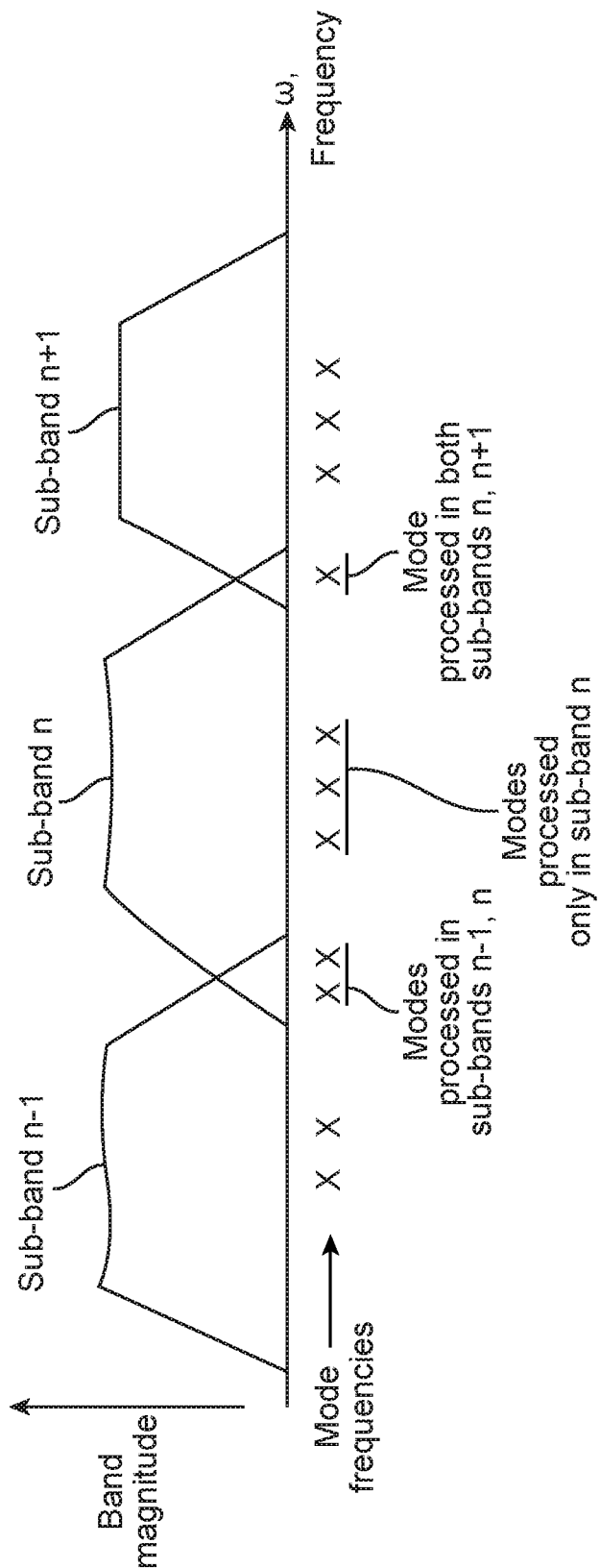
FIG. 7 is a diagram illustrating aspects of overlapping transition bands according to embodiments.

Note that the band filters $b_n(t)$ may be designed so that their transition bands overlap, while their pass bands don't overlap, as shown in FIG. 7. In this case, modes having mode frequencies lying within a subband filter pass band are assigned to that band only. Modes having mode frequencies lying within adjacent filter transition bands are assigned to those adjacent bands.

Figure 8:
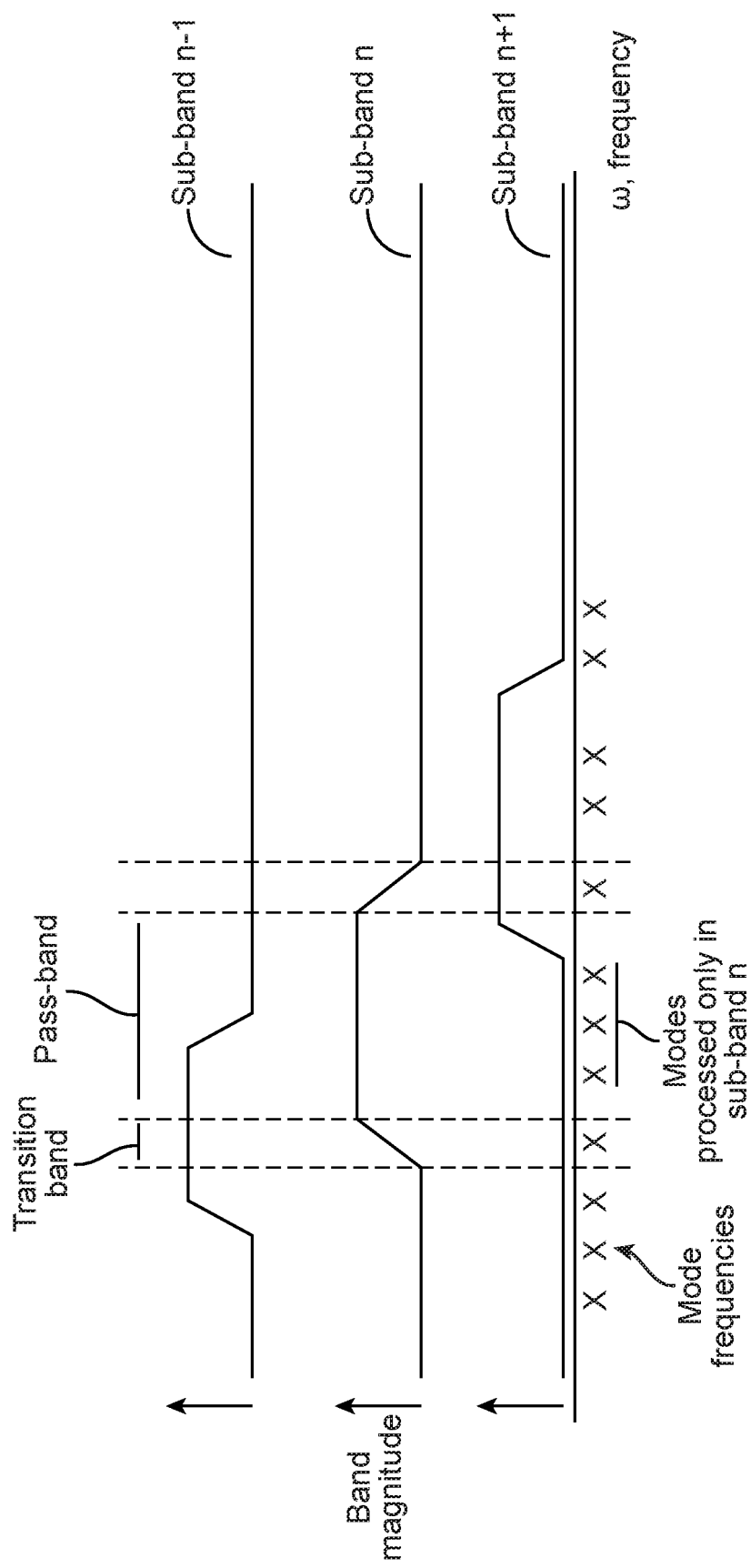
FIG. 8 is a diagram illustrating aspects of overlapping pass bands according to embodiments.

Similarly, the band filters $b_n(t)$ may be designed to have overlapping pass bands, as seen in the example of FIG. 8. In this case, modes are each assigned to only one subband, preferably the subband having the center of its passband closest to the mode frequency.

For a given modal filter having a set of mode frequencies, and processed according to the subband processing of FIG. 5, the computational cost will be the cost of the band filtering b(t) and related reconstruction filtering, which is roughly proportional to the number of bands, and the cost of the downsampled mode filters, which is roughly proportional to the sum over the bands n=1, 2, . . . , N of the number of modes divided by the downsampling factor in each band, $P_n/R_n$. The number and bandwidth of subbands is preferably designed to minimize computational cost. By having more, smaller bandwidth subbands, greater downsampling factors $R_n$, are achieved, though there are fewer modes processed at the efficient downsampled sampling rate and increased cost of filtering and other overhead.

Figure 9A:
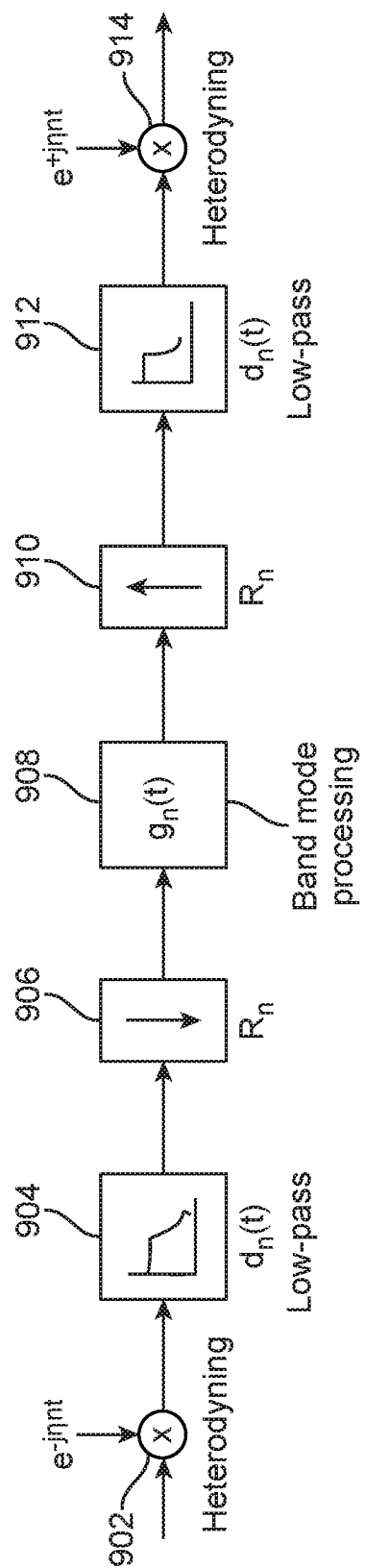
FIGS. 9A and 9B are block diagrams illustrating other examples of subband band processing according to embodiments.

The subband processing may also be done using heterodyning and modulation, as illustrated in FIG. 9A. Here, the input signal is heterodyned at 902 down to baseband by a complex exponential at frequency n and low-pass filtered by $d_n(t)$ at 904. The resulting signal is downsampled at 906 and processed according to mode filters 908 assigned to the subband, n. The mode frequencies, dampings, and amplitudes are modified according to the modulation frequency, downsampling ratio, and filter characteristics. For example, the subband mode frequency $\tilde{\omega}_p$ should be set to $$\tilde{\omega}_p = \text{rem}(R_n(\omega_p - \eta_n), 2\pi), \quad (13)$$

as the original mode frequency $\omega_p$ becomes $\omega_p - \omega_n$ when it is heterodyned to baseband. The processed downsampled signal is then upsampled at 910, filtered at 912, and modulated at 914 to its output frequency band, typically by n, the same frequency used to heterodyne the band.

Figure 9B:
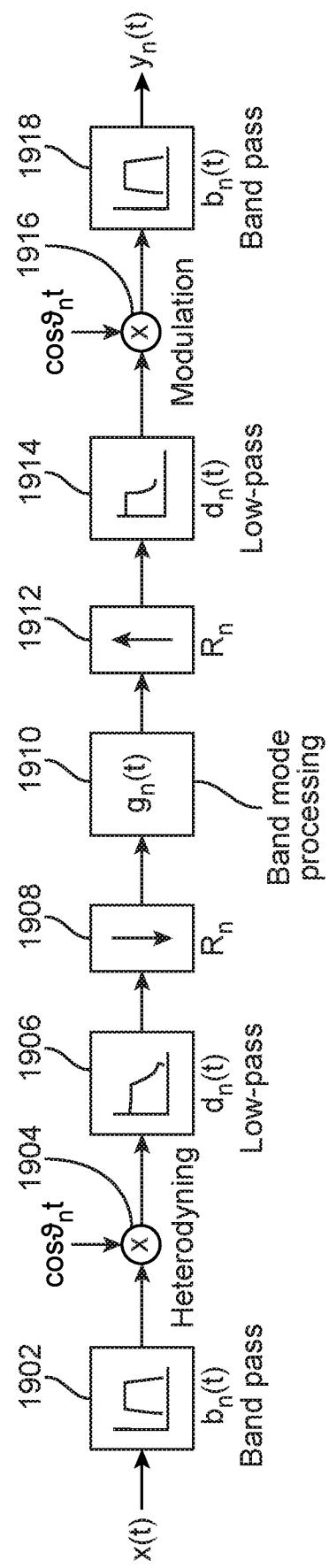

Another approach to band processing using real-valued signals is shown in FIG. 9B. The input signal is applied to a band-pass filter 1902, which passes signals in the frequency range of subband n [$f_-$, $f_+$], and heterodyned to baseband 1904 according to frequency $v_n$, which is at or slightly less then $f_{b-}$. In this way, the output of low pass 1906 is a real low-pass signal having energy about dc that was formerly in the nth subband. The signal is then downsampled 1908 and processed according to the band mode filtering 1910, then upsampled 1912, low-pass filtered 1914, modulated to the nth subband 1916, and band passed to eliminate complements near dc.

Figure 12A:
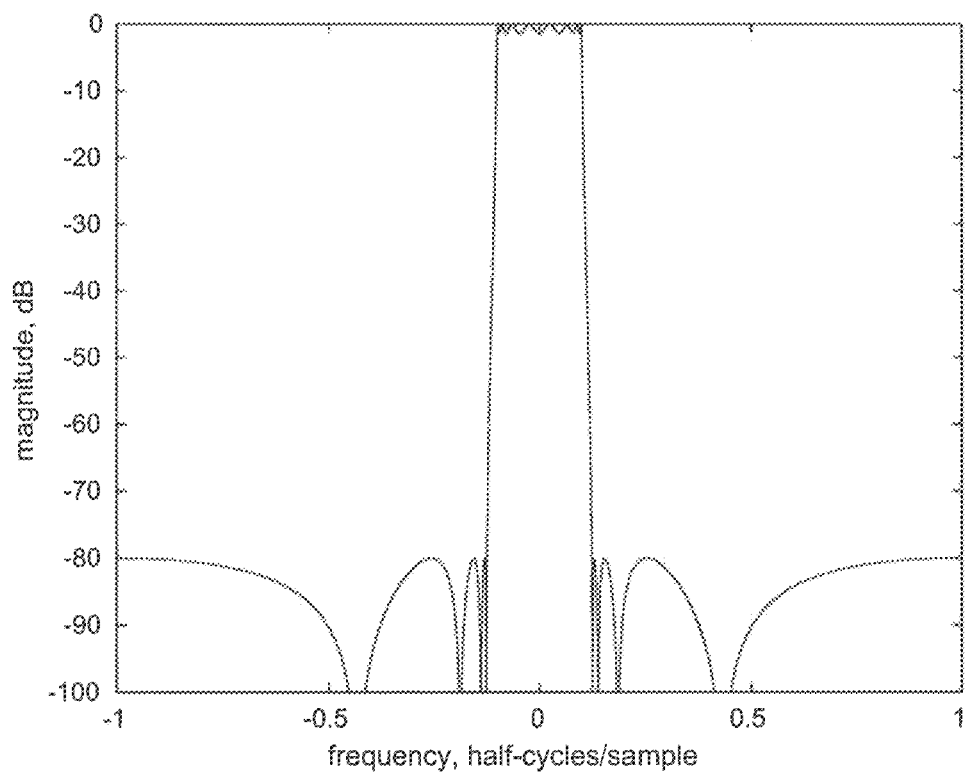
FIGS. 12A to 12C are diagrams illustrating aspects of the subband band processing performed in accordance with the example of FIG. 9B.
Figure 12B:
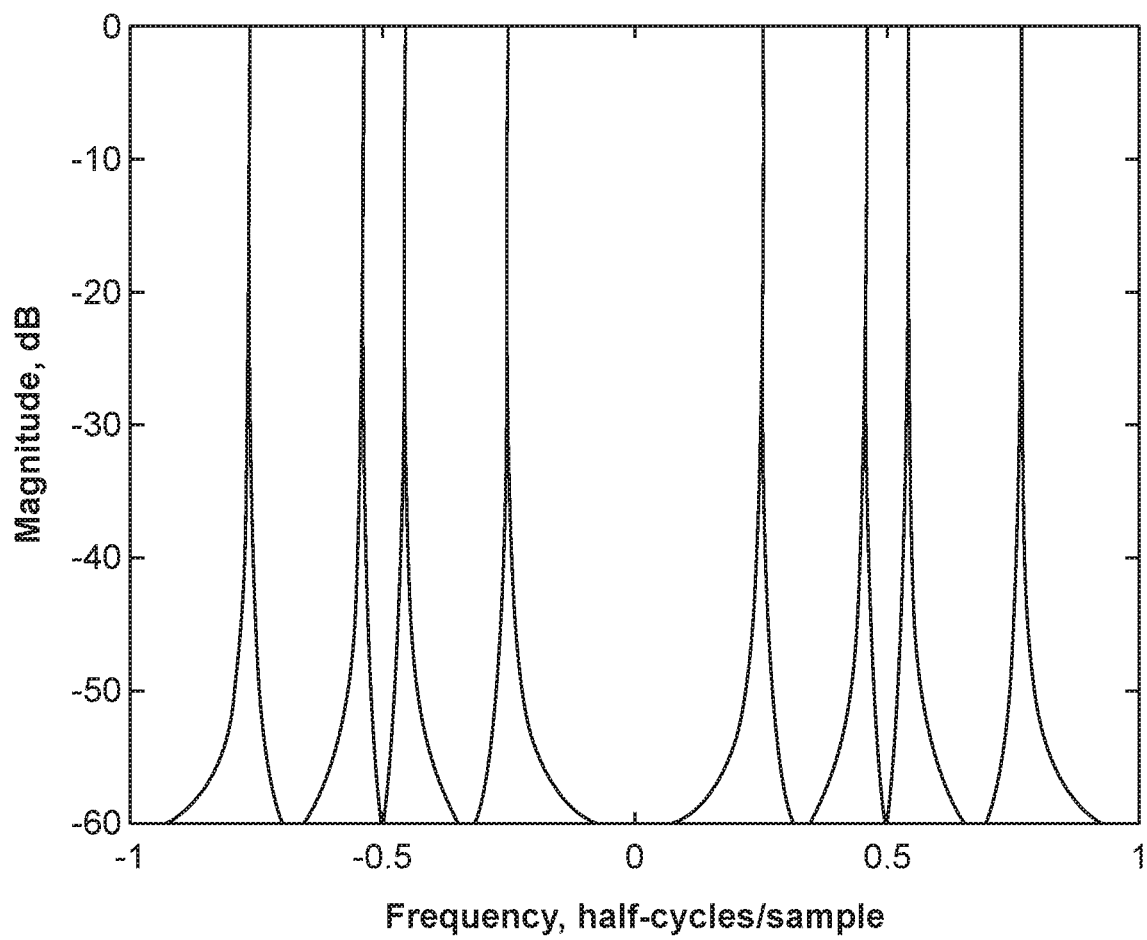
Figure 12C:
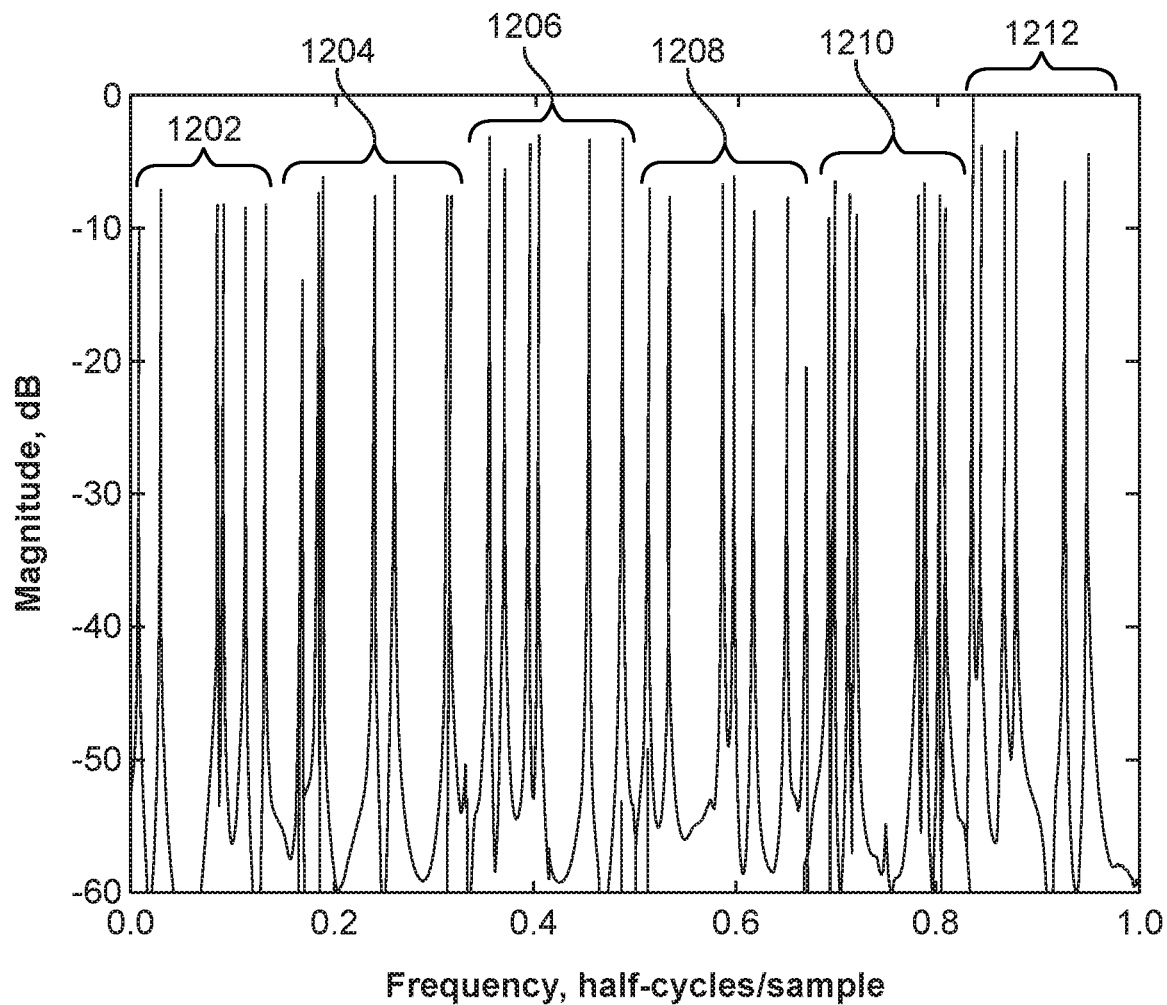

As an example of the processing performed by the embodiment of FIG. 9B, the elliptic low-pass filter with magnitude transfer function characteristic shown in FIG. 12A was used in creating six bands of equal bandwidth that overlapped in frequency by a factor of 1.2 as illustrated in FIG. 8, with guard bands that produced a downsampling ratio of R=4, independent of the band number. An example frequency-shifted, and gain and damping-compensated downsampled response 1910 is shown in FIG. 12B. Note that only selected modes appear in this example band. Finally, the processed response transfer function is shown in FIG. 12C, with different sections 1202, 1204, 1206, 1208, 1210, 1212 indicating the six different band responses.

Figure 10:
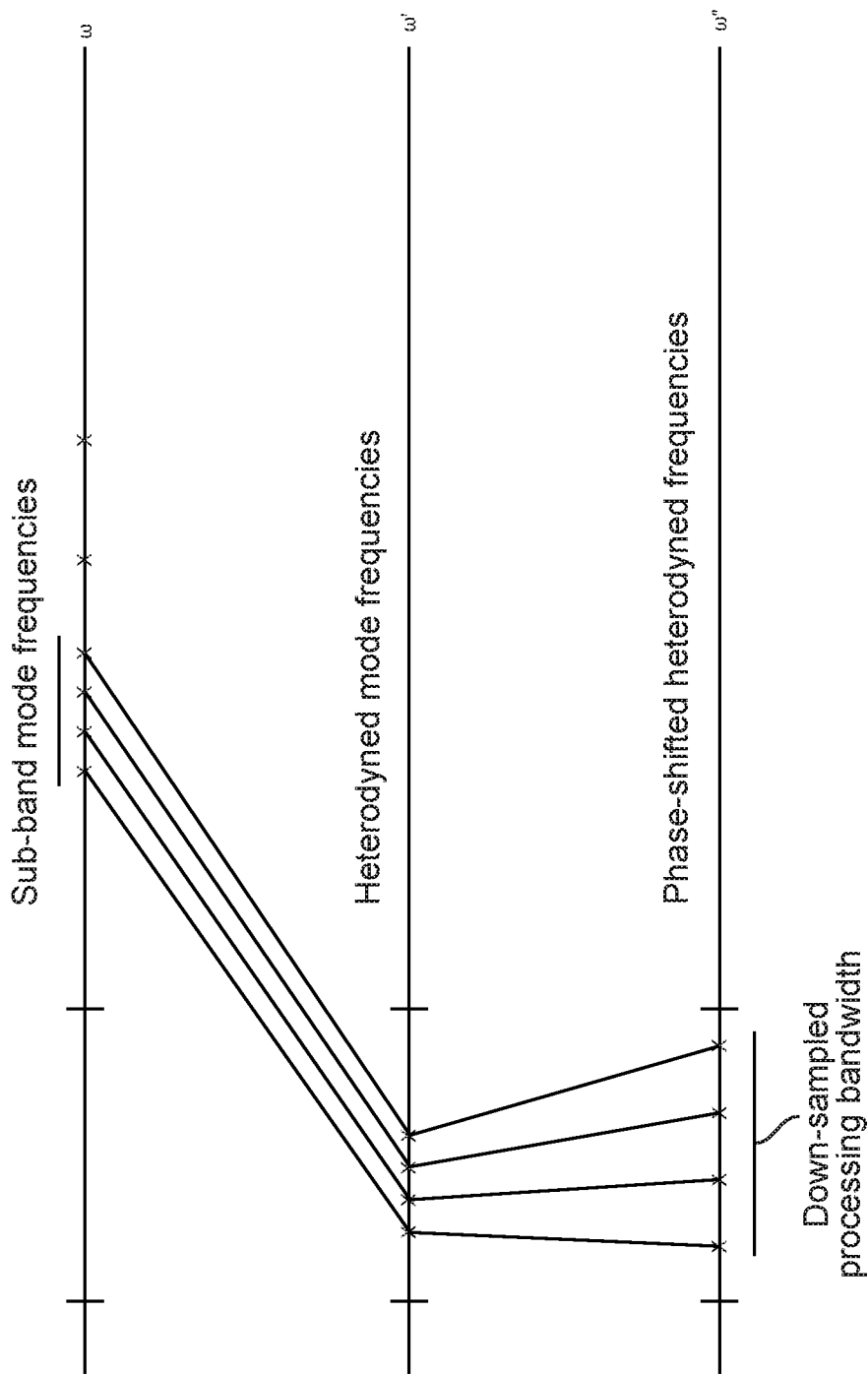
FIG. 10 is a block diagram illustrating example subband modal pitch shift processing and distortion according to embodiments.

In certain implementations of the modal filter, a frequency shifting is implemented, in effect modulating the mode envelope by an output frequency $v_m$ that is different from the mode frequency $\omega_m$ (e.g., [3]). In the context of subband processing, a group of modes that are shifted to higher frequencies will occupy a greater output bandwidth, as shown in FIG. 10. Accordingly, the downsampling ratios $R_n$ should be adjusted to prevent aliasing. So as to minimize the bandwidth occupied by the output, and therefore maximize the available downsampling ratio $R_n$, the heterodyne and modulation frequencies can be different. The band heterodyne frequency n may be set so that the frequency-shifted band mode frequencies are centered about a band modulation frequency $\mu_n$ that produces the desired set of output mode frequencies. In this way, at baseband, the frequency-shifted mode filter frequencies would be centered about dc, and occupy minimum bandwidth. Note that if a group of mode frequencies are shifted to lower frequencies, then their bandwidth would be made smaller, relaxing constraints on the resampling $R_n$.

Figure 11:
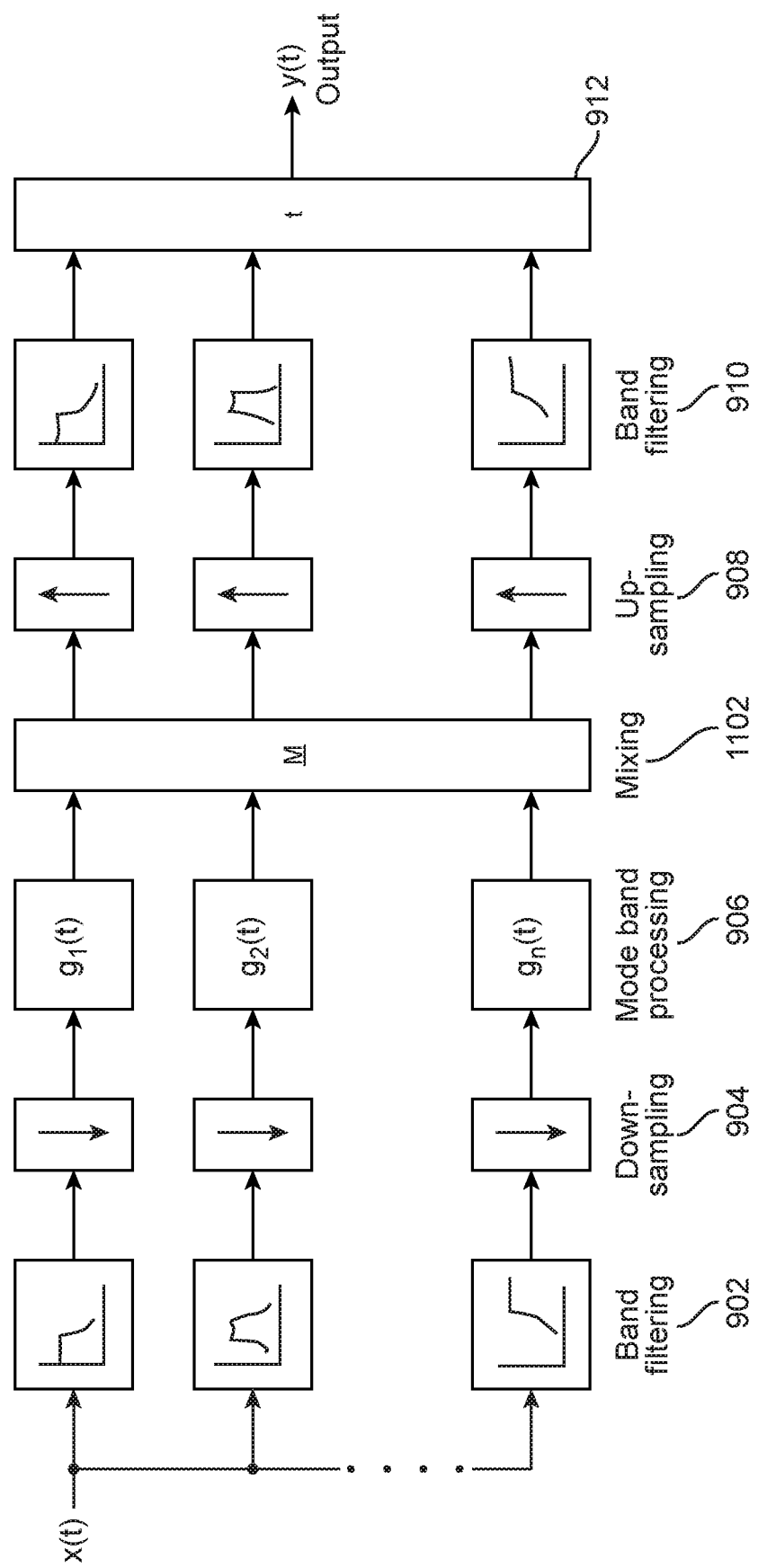
FIG. 11 is a block diagram illustrating an example of combining subband processes according to embodiments.

In the presence of distortion processing, additional partials are generated. Such additional partials would significantly increase the bandwidth of the subband output, and reduce the computational savings afforded by the subband architecture. In this case, as seen in FIG. 11, mode filters applied in one subband n at a downsampled rate, can be added into the output of other subbands n', preferably which use the same downsampling ratio. In FIG. 11, this process is shown using subband filters and mixing matrix M, which has nonzero entries for each of the series of partials generated by the pth mode filter. Here, the subband n mode filter p frequency (and related partial frequencies) should be adjusted to take into account the output through subband n'.

Note that this architecture is also applicable to any case in which a mode frequency is shifted out of its respective band. In such cases, the matrix M could be sparse, having only one nonzero entry for each mode filter p.

While the processor of FIG. 11 employs the subband processing of FIG. 6, any number of other subband processing architectures may be used. For instance, the subband processing architecture of FIG. 9 (having band filtering 902, downsampling 904, band processing at 906, upsampling at 908, filtering at 910 and summing at 912) could be used in the structure of FIG. 11, with the mixing matrix 1102 inserted before the modulation 914. Here, the mode p modulation would be at a frequency $\beta_p$ such that the subband n heterodyne frequency $\eta_n$ and the subband n' modulation frequency $\mu_{n'}$ combine to produce the desired partial or pitch shifted frequency.

Although the present embodiments have been particularly described with reference to preferred examples thereof, it should be readily apparent to those of ordinary skill in the art that changes and modifications in the form and details may be made without departing from the spirit and scope of the present disclosure. It is intended that the appended claims encompass such changes and modifications.

What is claimed is:

1. A method comprising:
receiving a source signal; and
applying artificial reverberation to the source signal by processing the source signal in parallel using a plurality of mode filters having respective mode frequencies, the processing includes:
processing the source signal in frequency subbands defined by a bank of filters, at least two of the filters having non-overlapping pass bands, transition bands, and stop bands, and with each frequency in the audio band appearing in either a single pass band, or a pair of transition bands,
wherein each mode filter of the plurality of mode filters is assigned to a single subband or a pair of subbands according to its respective mode frequency.

2. The method of claim 1, further comprising:
forming downsampled subband signals; and
processing the downsampled subband signals with an associated down sampled mode filter.

3. The method of claim 1, further comprising:
forming downsampled subbands through a process that includes heterodyning, low-pass filtering, and down-sampling.

4. The method of claim 3, wherein the mode frequencies are adjusted according to the heterodyning frequency and downsampling factor.

5. The method of claim 1, wherein the mode filters have respective mode gains, and wherein the mode gains are adjusted according to the characteristics of filters used to split the signal into subbands.

6. The method of claim 5, wherein the adjustments accommodate pass band ripple.

7. The method of claim 1, wherein the mode frequencies are used to design subband frequency ranges and associated downsampling factors.

8. The method of claim 7, wherein the downsampling factors and subband frequency ranges are configured to accommodate increased bandwidth from pitch processing.

9. The method of claim 1, wherein processing further includes:
initially processing distortion products or frequency shifted components in one subband; and
adding the distortion products or frequency shifted components into other subbands at the same downsampling factor.

10. The method of claim 1, wherein each of the filters in the bank of filters has a respective pass band, transition band and stop band corresponding to a respective one of the frequency subbands, and wherein the mode filters operate on the source signal after processing by the bank of filters.

11. A method comprising:
receiving a source signal; and
applying artificial reverberation to the source signal by processing the source signal in parallel using a plurality of mode filters having respective mode frequencies, the processing includes:
processing the source signal in frequency subbands defined by a bank of filters, at least two of the filters having non-overlapping pass bands, transition bands, and stop bands, and with each frequency in the audio band appearing in either a single pass band, or a pair of transition bands,
wherein each mode filter of the plurality of mode filters is assigned to a single subband or a pair of subbands according to its respective mode frequency; and
applying a wideband residual filter in parallel with the subband processing.

12. A method comprising:
receiving a source signal; and
applying artificial reverberation to the source signal by processing the source signal in parallel using a plurality of mode filters having respective mode frequencies, the processing includes:
processing the source signal in frequency subbands defined by a bank of filters, at least two of the filters having overlapping pass bands, and with each frequency in the audio band appearing in either a single pass band, or a pair of transition bands,
wherein each mode filter of the plurality of mode filters is assigned to a single subband or a pair of subbands according to its respective mode frequency.

13. The method of claim 1, further comprising:
summing outputs of the plurality of mode filters to produce an artificially reverberated version of the source signal.

14. The method of claim 12, wherein the plurality of mode filters have been designed in accordance with desired properties of one of a room and a resonating object.

15. The method of claim 14, wherein the plurality of mode filters have been designed by measuring an impulse response of the room and selecting a plurality of mode frequencies using the measured impulse response.

16. The method of claim 15, wherein the plurality of mode filters respectively correspond to the plurality of selected mode frequencies.

17. The method of claim 15, wherein the plurality of mode frequencies have been selected by comparing a measured amplitude of each of the plurality of mode frequencies with a threshold.

* * * * *